United States Patent [19]

Adam

[11] Patent Number: 4,580,247
[45] Date of Patent: Apr. 1, 1986

[54] SEMICONDUCTOR FLOATING GATE MEMORY CELL

[75] Inventor: Fritz G. Adam, Freiburg, Fed. Rep. of Germany

[73] Assignee: Deutsche ITT Industries GmbH, Freiburg, Fed. Rep. of Germany

[21] Appl. No.: 729,279

[22] Filed: May 1, 1985

[30] Foreign Application Priority Data

May 7, 1984 [EP] European Pat. Off. ........ 84105116.2

[51] Int. Cl.⁴ ............................................. G11C 11/40
[52] U.S. Cl. ..................................... 365/200; 365/185
[58] Field of Search ................................ 365/200, 185

[56] References Cited
U.S. PATENT DOCUMENTS 4,514,830  4/1985  Hagiwara et al. .................. 365/200

Primary Examiner—Terrell W. Fears
Attorney, Agent, or Firm—Donald J. Lenkszus

[57] ABSTRACT

A semiconductor memory cell includes a source-drain series connection of several memory transistors each comprising electrically floating gates and being of the depletion type, with a selection transistor being disposed between a first bit line and a second bit line. The memory cell remains programmable as long as one of the series-arranged memory transistors has an injector oxide free from defects. The memory transistors having an injector oxide damaged by a breakdown are not programmable but do not affect the programmability of the respective semiconductor memory cell.

8 Claims, 6 Drawing Figures

10 μm

SEMICONDUCTOR FLOATING GATE MEMORY CELL

BACKGROUND OF THE INVENTION

The invention relates to a semiconductor memory cell comprising an electrically floating gate which is rechargeable with the aid of a charge injector and extends throughout the channel region of a memory transistor whose source-drain region is connected in series with the source-drain region of a selection transistor between a first bit line and a second bit line of a memory matrix.

Such types of memory cells are known, for example, from the technical journal "Electronics" of Feb. 10, 1982, pp. 121 and 122, and from the technical journal "IBM Technical Disclosure Bulletin" 23/2 (July 1980) pp. 661 to 663.

A serious manufacturing yield problem occurs in the manufacture of memory (storage) matrices comprising memory (storage) cells which contain electrically reprogrammable insulated-gate field-effect memory transistors because only memory matrices can be used having memory cells which are all unobjectionable.

International patent application No. WO 83/02847 shows one attempt to solve this problem by providing redundant columns which, upon detection of one or more faulty cells in a column, are switched instead of the defective column by employing a programmable redundancy decoder.

In European Pat. No. 0,098,079 an electrically programmable redundancy decoder is used which, in accordance with its programming, replaces a defective memory cell, upon selection, with an unobjectionable memory cell.

Such measures for solving the aforementioned problem, however, involve an additional peripheral circuit investment, and also require a measuring of the memory matrix and a programming of the circuit means for effecting the replacement of a defective cell by a redundant faultless cell.

For the purpose of overcoming these disadvantages, the invention proceeds from the idea of providing a memory cell having an "internal" redundancy, that is, a memory cell which is capable of maintaining its storage property upon occurrence of a fault in the insulating layer surrounding the storage medium, in particular of a fault of the injector oxide between the semiconductor substrate and the floating gate, without requiring the investment of a peripheral redundancy decoder and the re-addressing for replacing a faulty memory cell by an unobjectionable redundant cell. Such a memory cell would not only increase the yield in functionable memory matrices, but would also improve the endurance, because then there is also maintained the storage capacity of the cell when local defects in the cell occur in the course of the operating time.

SUMMARY OF THE INVENTION

It is one object of the invention to improve both the yield and the endurance of integrated memory matrices employing such memory cells.

A semiconductor floating gate memory cell in accordance with the invention differs from conventional memory cells first of all in that, instead of one individual memory transistor, there is provided a source-drain series arrangement of such memory transistors whose programming gates are connected to the programming line. The channel regions of the memory transistors between the pairs of source-drain regions are in such a way doped with impurity atoms of the same conductivity type as the regions, for example, by way of a masked ion implantation, that the memory transistors will be of the depletion type. In this way it is accomplished that in the event of a failure of one memory transistor owing to a breakdown in the injector oxide, this memory transistor will no longer be programmable, but remains conductive, so that the respective memory cell as a whole will remain unchanged programmable.

In one preferred type of embodiment of the memory cell according to the invention, the injectors of the memory cell are only selectable via the source-drain region of an injector selection transistor. Among others, this offers the advantage that distrubances of the charge as stored on the floating gate of the memory cell, are excluded during a reading cycle, because there exists no connection between the injectors and the first bit line. The gate electrode of the injector selection transistor is preferably likewise connected to the word line of the semiconductor floating gate memory cell.

BRIEF DESCRIPTION OF THE DRAWING

The invention will be better understood from a reading of the following detailed description in conjunction with the drawing in which.

DETAILED DESCRIPTION

Figure 1:
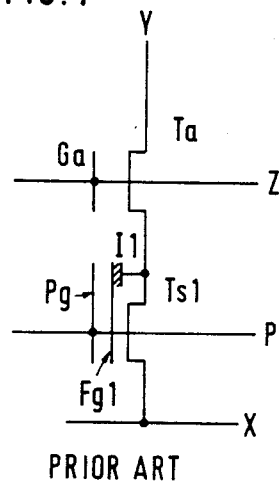
FIG. 1 is the circuit diagram of a conventional type of semiconductor floating gate memory cell.

FIG. 1 shows the circuit diagram of a conventional type of semiconductor memory cell which, in a source-drain series arrangement between the first bit line X and the second bit line Y, contains the memory transistors Ts1 and the selection transistor Ta. The gate electrode Ga of the selection transistor Ta is connected to the word line Z via which the selection transistors of one row of the memory matrix can be selected thus permitting, in connection with suitable potentials at the bit lines X and Y, the reading, writing or else also the erasing of an individual memory cell. The memory transistor Ts1 contains the electrically floating memory gate Fg1 which, via the injector 11 can be charged or discharged. Between the floating gate Fg1 and the injector electrode there is positioned the gate oxide as schematically hatchlined in FIG. 1, with the thickness thereof ranging between about 50 and 150 Å, so that it can be tunnelled by the electrons. The floating gate Fg1 can be selected capacitively via the programming electrode Pg for effecting either the writing or erasing, with the necessary potential being applied to the programming line P.

Figure 2:
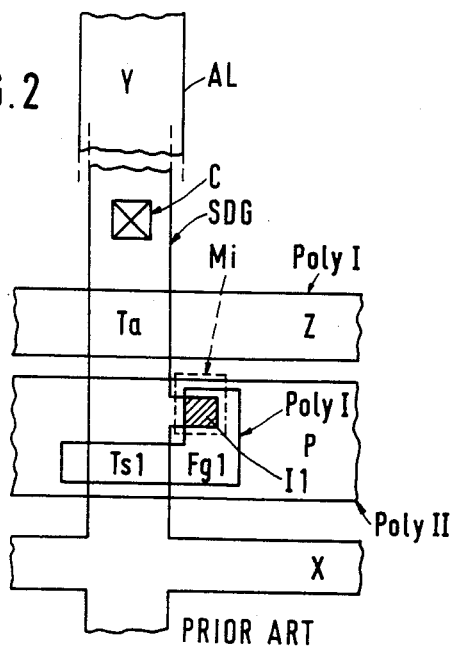
FIG. 2 shows the layout thereof.
Figure 6:
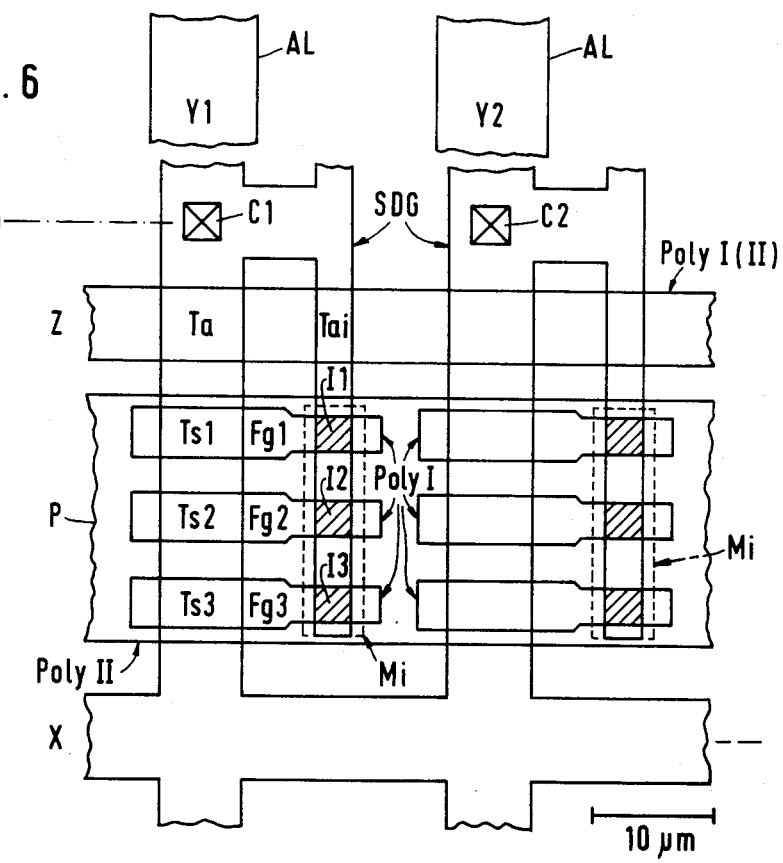
FIG. 6 shows the layout of that part of the memory matrix as shown in FIG. 5.

FIG. 2 shows the Si-gate design of the conventional memory cell as shown in FIG. 1 which is featured by the use of two conductor levels of polycrystalline silicon. The word line Z designated by poly-I, and the electrode Fg likewise designated by poly-I are etched out of this polycrystalline silicon. The actual manufacturing process, however, starts with the process of establishing the field area coated with a field oxide, outside the SDG areas of the first mask, within the limitation of which there is then first of all exposed the semiconductor surface. After that, the exposed substrate surface is oxidized for producing the gate oxide. Next, by employing a second mask M2 containing the tunnel oxide areas, there is then exposed the hatchlined area as shown in FIG. 2, and the tunnel oxide of the injector I1 is produced in the necessary thickness. Thereafter, there is effected the already mentioned poly-I process with the restriction of the word line Z of the floating gate Fg. After that, the gate oxide is removed in the areas not covered with the polycrystalline silicon, so that in the course of the following implantation and/or diffusion process, there will result the doped source regions or drain regions respectively. Onto the oxidized polycrystalline silicon and the base material covered with the field oxide, there is now deposited a second polycrystalline silicon layer from which, by employing the mask designated poly-II, there is etched out the programming line P. This programming line P, as is illustrated in FIG. 2, covers the floating gate Fg1, thus providing the necessary capacitive coupling. FIG. 2 likewise shows that together with the regions, there was diffused the first bit line X on account of the shaping of the SDG mask which, at the point C is contacted with the zone of the selection transistor Ta, hence contacted in the form of an alluminum conductor lead A1. In fact, the second bit line Y extends transversely in relation to all of the word lines Z and the programming lines P of the memory matrix, as is obvious from FIG. 2. The manufacturing process described hereinbefore is applicable in the same way to the layouts as shown in FIGS. 4 and 6.

Figure 3:
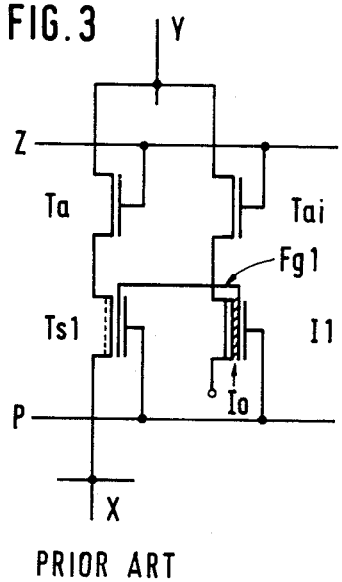
FIG. 3 is the circuit diagram of a further cnventional type of semiconductor floating gate memory cell.

FIG. 3 shows the circuit diagram of a further conventional type of semiconductor memory cell comprising an electrically floating gate Fg1 as was known from the aforementioned prior art reference "Electronics" of Feb. 10, 1982. In this particular memory cell, the tunnel oxide of the injector I1 is electrically separated from the first bit line X to which approximately 2 V is applied during the reading. Since, simultaneously, the zero potential is applied to the second bit line Y as well as to the word line Z, the tunnel oxide of the non-selected memory cells are not loaded during a reading cycle.

Figure 4:
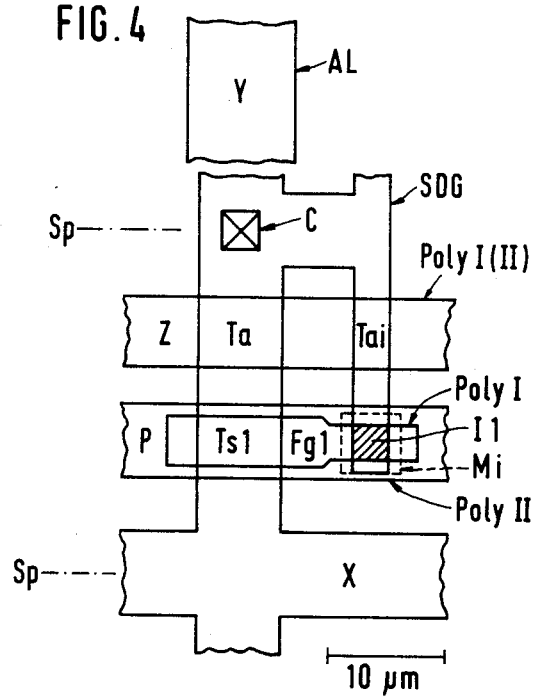
FIG. 4 shows the layout of the semiconductor floating gate memory cell as shown in FIG. 3, FIG. 5 as part of a memory matrix, shows two semiconductor floating gate memory cells according to the invention.

The layout of the memory cell as shown in FIG. 3 in a memory matrix designed in accordance with the well known Si-gate technique, is made in accordance with FIG. 4. In that case, the memory cells are disposed symmetrically in relation to the symmetry lines Sp.

A preferred embodiment of a semiconductor memory cell according to the invention will now be described. Two memory cells which are part of a memory matrix are shown as an equivalent circuit diagram in FIG. 5. The layout of these two memory cells is shown in FIG. 6.

It is evident from the layout of FIG. 6 that a particularly space-saving layout is obtained because the injectors I1, I2 and I3 merely occupy parts of two strip-shaped areas extending parallel in relation to one another, which are produced by doping of the exposed semiconductor surface carried out subsequently to the SDG masking. These parallel-extending areas which continue into the first bit line X, are restricted on their longitudinal sides by the field-oxide layer occupying the areas outside the SDG masking.

Figure 5:
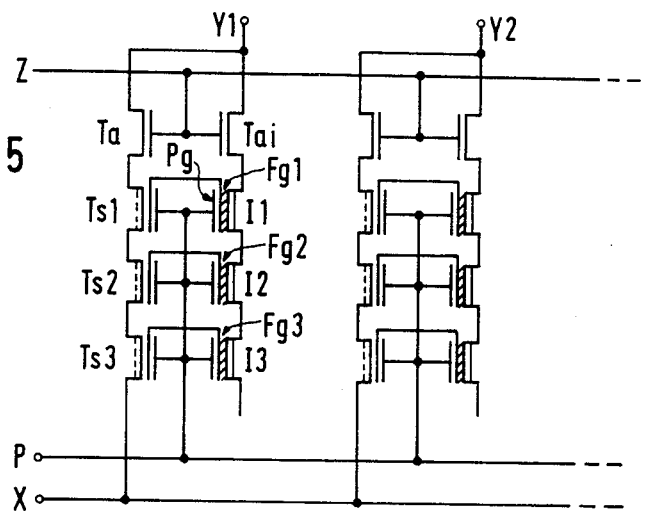

The embodiment shown in FIGS. 5 and 6 is a triple memory cell, with two of the memory transistors being redundant. Each of the memory transistors Ts1, Ts2 and Ts3 and the injectors I1, I2, I3 as respectively lying next to them, has a special floating gate common to all. Of course, instead of two redundant memory transistors, any other number, for example, merely one or else also more than two redundant memory transistors with the associated injectors may be provided for, with the space requirements in relation to the reliability having to be considered. This additional space requirement of redundant memory transistors, however, remains rather unimportant because additional control leads and control logics including the redundancy decoders necessary according to the prior art, are not required.

If a defect in a partial cell of the memory cell occurs due to a breakdown in the injector oxide, the floating gate Fg1, Fg2 or Fg3 of the respective partial cell is short-circuited with the second bit line Y, so that the partial cell is not longer programmable. The associated memory transistor Ts1, Ts2 or Ts3, however, remains conductive because all of the memory transistor Ts1, Ts2, Ts3 are of the depletion type. For this purpose, dopings of the conductivity type of the source-drain regions are introduced into the gate areas of the memory transistors by a masked ion implantation. Accordingly, it is sufficient for the proper functioning of the memory cell for at least one of the series-arranged partial cells to remain free from defects and, consequently, programmable. This considerably increases the yield in functionable memories.

What is claimed is:

1. A semiconductor memory cell for use in a memory matrix said matrix including a first bit line, a second bit line, a programming line and a word line, said cell comprising:
    a serial branch between said first and second bit lines, said serial branch comprising a plurality of transistors having their source-drain regions connected in series and including at least a selection transistor and first and second memory transistors;
    a first floating gate extending throughout the channel region of said first memory transistors; a first charge injector for recharging said first floating gate;
    a first programming gate capacitively coupled to said first floating gate;
    a second floating gate extending throughout the channel region of said second memory transistor;
    a second charge injector for recharging said second floating gate;
    a second programming gate capacitively coupled to said second floating gate;
    said first and second programming gates being coupled to said programming line; and
    said selection transistor having its gate connected to said word.

2. A semiconductor memory cell in accordance with claim 1 comprising:
    an injector selection transistor for selecting said first and second injectors of said cell.

3. A semiconductor memory cell in accordance with claim 2 wherein said injector selection transistor has its gate electrode coupled to said word line.

4. A semiconductor memory cell in accordance with claim 3 wherein said first and second injectors are connected in series and are separated from said memory transistors by a relatively narrow strip of field oxide.

5. A semiconductor memory comprising:
a plurality of memory cells arranged cell for in a memory matrix;
a first bit line;
a second bit line;
a programming line; and
a word line;
said cell comprising:
a serial branch between said first and second bit lines, said serial branch comprising a plurality of transistors having their source-drain regions connected in series and including at least a selection transistor and first and second memory transistors;
a first floating gate extending throughout the channel region of said first memory transistors; a first charge injector for recharging said first floating gate;
a first programming gate capacitively coupled to said first floating gate;
a second floating gate extending throughout the channel region of said second memory transistor;
a second charge injector for recharging said second floating gate;
a second programming gate capacitively coupled to said second floating gate;
said first and second programming gates being coupled to said programming line; and
said selection transistor having its gate connected to said word.

6. A semiconductor memory cell in accordance with claim 5 comprising:
an injector selection transistor for selecting said first and second injectors of said cell.

7. A semiconductor memory cell in accordance with claim 6 wherein said injector selection transistor has its gate electrode coupled to said word line.

8. A semiconductor memory cell in accordance with claim 7 wherein said first and second injectors are connected in series and are separated from said memory transistors by a relatively narrow strip of field oxide.

* * * * *